(12) United States Patent
Shinagawa et al.

(10) Patent No.: US 8,963,229 B2
(45) Date of Patent: Feb. 24, 2015

(54) NON-VOLATILE SEMICONDUCTOR MEMORY DEVICE

(71) Applicant: Floadia Corporation, Tokya (JP)

(72) Inventors: Yutaka Shinagawa, Tokyo (JP); Hideo Kasai, Tokyo (JP); Yasuhiro Taniguchi, Tokyo (JP)

(73) Assignee: Floadia Corporation, Tokyo (JP)

( * ) Notice: Subject to any disclaimer, the term of this patent is extended or adjusted under 35 U.S.C. 154(b) by 0 days.

(21) Appl. No.: 14/239,735

(22) PCT Filed: Sep. 18, 2012

(86) PCT No.: PCT/JP2012/073849
§ 371 (c)(1),
(2) Date: Feb. 19, 2014

(87) PCT Pub. No.: WO2013/042665
PCT Pub. Date: Mar. 28, 2013

(65) Prior Publication Data
US 2014/0203345 A1    Jul. 24, 2014

(30) Foreign Application Priority Data

Sep. 21, 2011  (JP) ................................. 2011-205934

(51) Int. Cl.
| | | |
|---|---|---|
| *H01L 27/115* | (2006.01) | |
| *G11C 16/04* | (2006.01) | |
| *G11C 16/24* | (2006.01) | |
| *G11C 16/34* | (2006.01) | |

(52) U.S. Cl.
CPC ...... *H01L 27/11517* (2013.01); *G11C 16/0483* (2013.01); *G11C 16/24* (2013.01); *G11C 16/3468* (2013.01)

USPC .............. 257/321; 257/331; 257/E21.682; 257/E29.306; 365/185.11; 365/185.21; 365/185.29

(58) Field of Classification Search
None
See application file for complete search history.

(56) References Cited

U.S. PATENT DOCUMENTS 7,123,510 B2 * 10/2006 Kojima et al. .......... 365/189.15
2002/0097621 A1 * 7/2002 Fujiwara ................. 365/204
(Continued)

FOREIGN PATENT DOCUMENTS

| JP | H10144807 A | 5/1998 |
|---|---|---|
| JP | 2001230332 A | 8/2001 |

(Continued)

*Primary Examiner* — Minh-Loan Tran
*Assistant Examiner* — Fazli Erdem
(74) *Attorney, Agent, or Firm* — Robert J. Sacco, Esq.; Fox Rothschild LLP

(57) ABSTRACT

A non-volatile semiconductor memory device is proposed whereby voltage can be more flexibly set in accumulating electric charges into a selected memory cell transistor in comparison with a conventional device. In a non-volatile semiconductor memory device (1), when a selected memory cell transistor (115) is caused to accumulate electric charges, high voltage as writing prevention voltage is applied from a PMOS transistor (9b) while low voltage as writing voltage is applied from an NMOS transistor (15a). Thus, a role of applying voltage to either the selected memory cell transistor (115) or a non-selected memory cell transistor (116) is shared by the PMOS transistor (9b) and the NMOS transistor (15a). Therefore, the gate voltage and the source voltage of the PMOS transistor (9b) and those of the NMOS transistor (15a) can be separately adjusted, and gate-to-substrate voltage thereof can be finally set to be, for instance, 4[V] or etc.

8 Claims, 6 Drawing Sheets

(56) References Cited

U.S. PATENT DOCUMENTS

2010/0214838 A1* 8/2010 Hishida et al. ........... 365/185.11
2012/0014181 A1* 1/2012 Ajika et al. .............. 365/185.11

FOREIGN PATENT DOCUMENTS

| | | |
|---|---|---|
| JP | 2005228446 A | 8/2005 |
| WO | 9708707 A1 | 3/1997 |

* cited by examiner

NON-VOLATILE SEMICONDUCTOR MEMORY DEVICE

CROSS REFERENCE TO RELATED APPLICATIONS

This application is the U.S. National Phase of International Patent Application Serial No. PCT/JP2012/073849 filed Sep. 18, 2012, which claims the benefit of Japanese Patent Application Serial No. 2011-205934, filed Sep. 21, 2011, both of which are incorporated herein by reference in their entireties.

TECHNICAL FIELD

The present invention relates to a non-volatile semiconductor memory device.

BACKGROUND ART

As an exemplary non-volatile semiconductor memory device, a type of non-volatile semiconductor memory device has been conventionally known that accumulates electric charges into a charge accumulation layer of a memory cell transistor by means of, for instance, a quantum tunneling effect in order to execute data writing (e.g., see PTL 1). Actually, as shown in FIG. 6, a non-volatile semiconductor memory device 100 of this type has a structure that higher order bit lines 101a and 101b and word lines 102a to 102h are disposed in an intersecting manner and a plurality of memory cell transistors 103 are disposed in a row and column matrix with respect to the higher order bit lines 101a and 101b and the word lines 102a to 102h.

The higher order bit line 101a is provided with a plurality of first semiconductor switches 104a and 104c, while a single lower order bit line 105a, 105c is connected to each first semiconductor switch 104a, 104c. Further, in this exemplary embodiment, the other higher order bit line 101b is also similarly provided with a plurality of first semiconductor switches 104b and 104d, while a single lower order bit line 105b, 105d is connected to each first semiconductor switch 104b, 104d. In such non-volatile semiconductor memory device 100, each lower order bit line 105a, 105b, 105c, 105d forms a memory block 106a, 106b, 106c, 106d, while each memory block 106a, 106b, 106c, 106d has the plural memory cell transistors 103.

The first semiconductor switches 104a, 104b, 104c and 104d are herein formed by N-MOS (Metal-Oxide-Semiconductor) transistors. Further, the first semiconductor switch 104a of the memory block 106a, for instance, is connected at the source thereof to the higher order bit line 101a while being connected at the drain thereof to the lower order bit line 105a, and is also connected at the gate thereof to a first selected gate line 108a shared with another memory block 106b aligned with the memory block 106a along a row direction. Thus, by this configuration, a predetermined gate voltage can be equally applied from the shared, single first selected gate line 108a to the two first semiconductor switches 104a and 104b that are mounted on the memory blocks 106a and 106b disposed in the upper part of FIG. 6.

On the other hand, similarly also in the two memory blocks 106c and 106d aligned along the row direction in the lower part of FIG. 6, a single first selected gate line 108b is connected to the two first semiconductor switches 104c and 104d, and a predetermined gate voltage is can be configured to be equally applied to the two first semiconductor switches 104c and 104d from the shared, first selected gate line 108b.

In addition to this, a higher order source line 110a is provided with a plurality of second semiconductor switches 111a and 111b, while a single lower order source line 112a, 112b is connected to each second semiconductor switch 111a, 111b. Further, the other higher order source line 110b is also similarly provided with a plurality of second semiconductor switches 111c and 111d, while a single lower order line 112c, 112d is connected to each second semiconductor switch 111c, 111d.

Further, the second semiconductor switches 111a, 111b, 111c and 111d are formed by NMOS transistors that the polarity thereof is the same as that of the first semiconductor switches 104a, 104b, 104c and 104d.

Herein, the second semiconductor switch 111a of the memory block 106a, for instance, is connected at the source thereof to the higher order source line 110a while being connected at the drain thereof to the lower order source line 112a, and is also connected at the gate thereof to a second selected gate line 113a shared with another memory block 106b aligned along the row direction in the upper part. Thus, a predetermined gate voltage can be configured to be equally applied from the shared, single second selected gate line 113a to the two second semiconductor switches 111a and 111b that are mounted on the different memory blocks 106a and 106b disposed in the upper part.

On the other hand, similarly also in the two memory blocks 106c and 106d aligned along the row direction in the lower part, a single second selected gate line 113b is connected to the two second semiconductor switches 111c and 111d, and a predetermined gate voltage can be configured to be equally applied to the two second semiconductor switches 111c and 111d from the shared, second selected gate line 113b.

Further, each memory cell transistor 103 on the memory block 106a, for instance, is connected at one terminal thereof to the lower order bit line 105a while being connected at the other terminal thereof to the lower order source line 112a, and thus, the memory cell transistors 103 are disposed in parallel to each other between the lower order bit line 105a and the lower order source line 112a. The word lines 102a, 102b, 102c and 102d, shared by the memory block 106a and another memory block 106b aligned along the row direction, are connected to control gates of the memory cell transistors 103 of the memory block 106a. Due to this, a predetermined gate voltage can be configured to be equally applied, for instance, from the shared, single word line 102a to one of the memory cell transistors 103 of the memory block 106a in the upper part and one of the memory cell transistors 103 of another memory block 106b aligned with the memory block 106a along the row direction in the upper part.

Incidentally, all the memory cell transistors 103 have the same structure that a channel region is disposed between one terminal and the other terminal, which are formed at a predetermined interval on a semiconductor substrate, and a charge accumulation layer, an interlayer insulation layer and a control gate are sequentially laminated through a tunnel insulation layer on the channel region of the semiconductor substrate. Such memory cell transistors 103 are of an N-channel type, and are capable of executing either data writing by injecting electric charges into the charge accumulation layer or data erasing by extracting the electric charges accumulated into the charge accumulation layer by means of voltage to be applied to the control gate and the region between the one terminal and the other terminal.

The non-volatile semiconductor memory device 100 thus structured can be configured to write data in a predetermined one of the memory cell transistors 103, read data from a predetermined one of the memory cell transistors 103 and erase data written in the memory cell transistors 103 by regulating voltages to be respectively applied to the higher order bit lines 101a and 101b, the higher order source lines 110a and 110b and the word lines 102a to 102h and by controlling on/off states of the first semiconductor switches 104a to 104d and the second semiconductor switches 111a to 111d.

In FIG. 6, the memory cell transistor 103 in the first row of the memory block 106a is set as a selected memory cell transistor 115 in which data is written, whereas all the remaining memory cell transistors 103 are set as non-selected memory cell transistors 116 in which data is not written.

It should be herein noted that for the sake of explanatory convenience, the memory block 106a on which the selected memory cell transistor 115 is disposed will be referred to as a selected block 117, whereas the memory blocks 106b, 106c and 106d on which only the non-selected memory cell transistors 116 are disposed will be referred to as non-selected blocks 118.

Actually in the non-volatile semiconductor memory device 100, for instance, when data is written in only the selected memory cell transistor 115 in the first row of the selected block 117, a high voltage of 12[V] is applied to a word line 120 (hereinafter referred to as a selected word line) that is the one connected to the selected memory cell transistor 115 among the plural word lines 102a to 102h, whereas a low voltage of 4[V] is applied to the word lines 121 (hereinafter referred to as non-selected word lines) that are the other remaining ones among the plural word lines 102a to 102h.

Further, at this time, in the non-volatile semiconductor memory device 100, a low voltage of 0[V] as a writing voltage can be applied to a higher order bit line 122 (herein referred to as a selected bit line) that is the one to which the selected memory cell transistor 115 is connected, whereas a high voltage of 8[V] as a writing prevention voltage can be applied to a higher order bit line 123 (herein referred to as a non-selected bit line) that is the one to which only the non-selected memory cell transistors 116 are connected. Moreover, in the non-volatile semiconductor memory device 100, a gate voltage of 10[V], which is higher than the voltage of the non-selected bit line 123, can be applied to the first semiconductor switches 104a and 104b from the first selected gate line 108a connected to the selected block 117, whereas a gate voltage of 0[V] can be applied to the second semiconductor switches 111a and 111b from the second selected gate line 113a.

Accordingly, in the non-volatile semiconductor memory device 100, the first semiconductor switch 104b on the non-selected bit line 123 is switched on by means of the writing prevention voltage from the non-selected bit line 123 and the gate voltage from the first selected gate line 108a, and a writing prevention voltage of 8[V] can be applied to the non-selected memory cell transistor 116 on the non-selected bit line 123 that intersects with the selected word line 120. At this time, the second semiconductor switches 111a, 111b, 111c and 111d are switched off by applying a voltage of 0[V] thereto from the higher order source lines 110a and 110b and by applying a voltage of 0[V] thereto from the second selected gate lines 113a and 113b, and the lower order source lines 112a, 112b, 112c and 112d can be turned into a floating state.

Thus, in the non-selected memory cell transistor 116 at which the selected word line 120 and the non-selected bit line 123 intersect with each other, a voltage difference is reduced between the control gate and the semiconductor substrate, and as a result, electric charges cannot be injected into the charge accumulation layer without occurrence of a quantum tunneling effect.

Further, at this time, the first semiconductor switch 104a on the selected bit line 122 is switched on by means of the writing voltage from the selected bit line 122 and the gate voltage from the first selected gate line 108a, and a writing voltage of 0[V] can be applied to the selected memory cell transistor 115 on the selected bit line 122 that intersects with the selected word line 120. Accordingly, in the selected memory cell transistor 115 at which the selected word line 120 and the selected bit line 122 intersect with each other, a voltage difference is increased between the control gate and the semiconductor substrate by means of the writing gate voltage applied from the selected word line 120. As a result, a quantum tunneling effect occurs and electric charges can be injected into only the charge accumulation layer of the relevant selected memory cell transistor 115. Consequently, in the non-volatile semiconductor memory device 100, only the selected memory cell transistor 115 can be set to be in a data written state while electric charges are accumulated into the charge accumulation layer thereof.

CITATION LIST

Patent Literature

PTL1: Japanese Patent Laid-open No. H10-144807

SUMMARY OF INVENTION

Technical Problem

However, the non-volatile semiconductor memory device 100 thus structured has had a drawback that in applying writing prevention voltage from the non-selected bit line 123 to the non-selected memory cell transistor 116 on the selected word line 120, it is required to apply a gate voltage of roughly 10[V], which is higher than a writing prevention voltage of 8[V] applied from the non-selected bit line 123, in order to switch on the first semiconductor switch 104b due to the first semiconductor switch 104 formed by an NMOS transistor, and therefore, voltage is inevitably increased by that much.

Further, the first selected gate line 108a is connected not only to the first semiconductor switch 104b on the non-selected bit line 123 but also to the first semiconductor switch 104a on the selected bit line 122 that applies writing voltage to the selected memory cell transistor 115. Therefore, a high gate voltage of 10[V], which is set to be relatively high for switching on the first semiconductor switch 104b on the non-selected bit line 123, can be also applied without change to the first semiconductor switch 104a on the selected bit line 122.

Thus, gate voltages having the same voltage value are equally applied to the first semiconductor switch 104a switched into an on-state on the non-selected bit line 123 and the first semiconductor switch 104b switched into an on-state on the selected bit line 122. Hence, there has been a drawback that it is difficult to execute a flexible setting, such as separately regulating respective gate voltages in order to reduce the voltage values of the respective gate voltages, in applying electric charges to a selected memory transistor.

Hence, the present invention has been made in consideration of the above, and is intended to propose a non-volatile semiconductor memory device whereby voltage in accumulating electric charges into a selected memory cell transistor can be further reduced and can be more flexibly set in comparison with a conventional device.

Solution to Problem

To solve the aforementioned problem, claim 1 of the present invention relates to a non-volatile semiconductor memory device that includes: a plurality of memory cell column wirings to which a charge accumulating voltage or a charge accumulating prevention voltage is applied; and a plurality of memory cell transistors having an N-channel type structure and disposed in a row and column matrix with respect to the plurality of memory cell column wirings and a plurality of word lines, and that causes a selected memory cell transistor in the plurality of memory cell transistors to accumulate electric charges based on a voltage difference between the charge accumulating voltage and a voltage to be applied to the word lines. The non-volatile semiconductor memory device comprises: a plurality of first semiconductor switches formed by PMOS transistors, the first semiconductor switches being provided for the respective memory cell column wirings; and a plurality of second semiconductor switches formed by NMOS transistors, the second semiconductor switches being provided for the respective memory cell column wirings, wherein, in a non-selected memory cell column wiring in which only non-selected memory cell transistors except for the selected memory transistor are disposed, the first semiconductor switches are configured to be switched on by means of a first gate voltage and to apply the charge accumulating prevention voltage to the non-selected memory cell transistors whereas, in a selected memory cell column wiring in which the selected memory cell transistor is disposed, the second semiconductor switches are configured to be switched on by means of a second gate voltage and to apply the charge accumulating voltage to the selected memory cell transistor.

Advantageous Effects of Invention

According to the present invention, when the selected memory cell transistor is caused to accumulate electric charges, aside from the first semiconductor switches applying the charge accumulating prevention voltage to the non-selected memory cell transistors, the second semiconductor switches are provided that are formed with a polarity opposite to that of the first semiconductor switches, and the second semiconductor switches are configured to be switched on by means of the second gate voltage and to apply the charge accumulating voltage to the selected memory cell transistor. Accordingly, it is possible to separately set the first gate voltage switching on the first semiconductor switches and the second gate voltage switching on the second semiconductor switches. Thus, it is possible to more flexibly set voltage in accumulating electric charges into the selected memory cell transistor in comparison with a conventional device.

Further, according to the present invention, for instance, the first gate voltage for switching on the first semiconductor switches and the second gate voltage for switching on the second semiconductor switches can be also separately reduced to have low voltage values capable of switching on the first semiconductor switches and the second semiconductor switches without being constrained by each other. It is thereby possible to reduce a voltage difference between a substrate and a gate in each first semiconductor switch of a switched-on state and that in each second semiconductor switch of a switched-on state. Thus, it is also possible to further relax electric fields to be applied to the respective gate insulating films in comparison with a conventional device.

Yet further, according to the present invention, the PMOS transistors are applied as the first semiconductor switches, while the NMOS transistors are applied as the second semiconductor switches. Therefore, the first gate voltage for switching on the PMOS transistors can be suppressed lower than the charge accumulating prevention voltage having a relatively high voltage value. Thus, voltage in accumulating electric charges into the selected memory cell transistor can be further reduced by that much in comparison with a conventional device.

Figure 1:
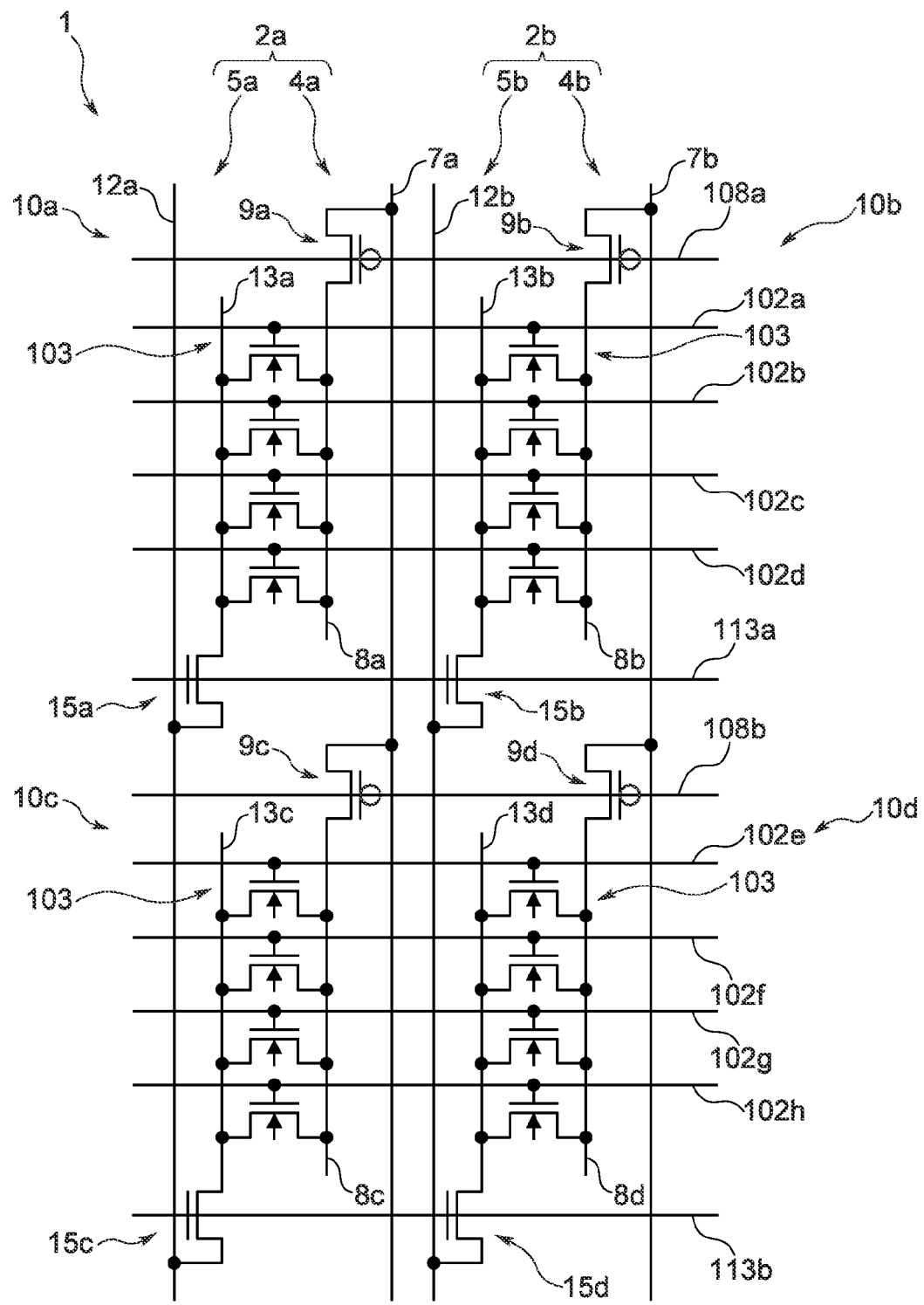
FIG. 1 is a circuit diagram showing a circuit configuration of a non-volatile semiconductor device according to a first embodiment.

REFERENCE SIGNS LIST 1, 25 Non-volatile semiconductor memory device
2a, 2b Memory cell column wiring
9a, 9b, 9c, 9d PMOS transistor (first semiconductor switch)
15a, 15b, 15c, 15d NMOS transistor (second semiconductor switch)
18a Selected memory cell column wiring
18b Non-selected memory cell column wiring
102a to 102h Word line
103 Memory cell transistor
115 Selected memory cell transistor
116 Non-selected memory cell transistor

DESCRIPTION OF THE EMBODIMENTS

Exemplary embodiments of the present invention will be hereinafter explained in detail with reference to the drawings.

Figure 6:
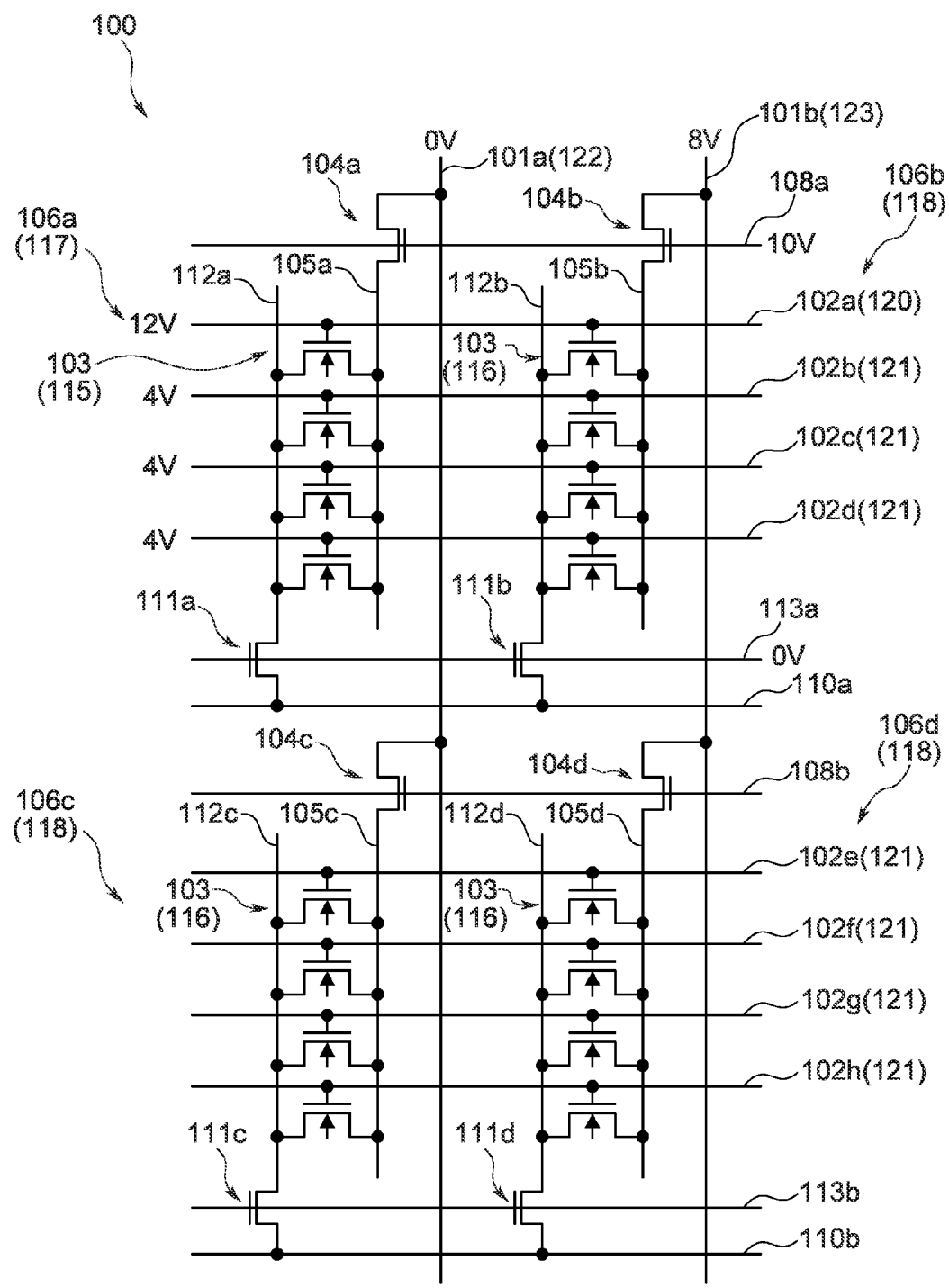
FIG. 6 is a circuit diagram showing a circuit configuration of a conventional non-volatile semiconductor memory device.

(1) First Embodiment (1-1) Entire Structure of Non-Volatile Semiconductor Memory Device In FIG. 1 shown with the same reference signs assigned to components corresponding to those in FIG. 6, a non-volatile semiconductor memory device according to the present invention is indicated by a reference sign 1, and a plurality of memory cell column wirings 2a and 2b and a plurality of word lines 102a to 102h are provided, while plurality of memory cell transistors 103 are disposed in a row and column matrix with respect to the memory cell column wirings 2a and 2b and the word lines 102a to 102h. The two memory cell column wirings 2a and 2b herein have the same structure. Therefore, for the sake of explanatory convenience, one of the memory cell wirings, i.e., the memory cell wiring 2a is focused while explanation of the other memory cell wiring 2b will be omitted.

Actually, the memory cell column wiring 2a is formed by a bit line 4a and a source line 5a, and has a structure that the plural memory cell transistors 103 are disposed in parallel to each other between the bit line 4a and the source line 5a. In the exemplary embodiment, the bit line 4a is formed by a higher order bit line 7a and two lower order bit lines 8a and 8c. The higher order bit line 7a is provided with a plurality of PMOS transistors 9a and 9c, while the single lower order bit line 8a, 8c is connected to each PMOS transistor 9a, 9c.

It should be noted that in FIG. 1, similarly in another bit line 4b, a higher order bit line 7b is provided with a plurality of PMOS transistors 9b and 9d, while a single lower order bit line 8b, 8d is connected to each PMOS transistor 9b, 9d as a first semiconductor switch. Thus, in the non-volatile semiconductor memory device 1, the two higher order bit lines 7a and 7b are provided with totally four lower order bit lines 8a, 8b, 8c and 8d, while a memory block 10a, 10b, 10c, 10d is formed for each lower order bit line 8a, 8b, 8c, 8d. The four memory blocks 10a, 10b, 10c and 10d, formed for the respective lower order bit lines 8a, 8b, 8c and 8d, herein have the same structure. Therefore, for the sake of explanatory convenience, one of the memory blocks, i.e., the memory block 10a is focused and explained, while explanation of the other memory blocks 10b, 10c and 10d will be omitted.

Unlike the conventional non-volatile semiconductor memory device 100, the non-volatile semiconductor memory device 1 according to the present invention is characterized in that, not NMOS transistors, but the PMOS transistors 9a, 9b, 9c and 9d are provided as the first semiconductor switches between the higher order bit line 7a and 7b and the lower order bit lines 8a, 8b, 8c and 8d. For example, the PMOS transistor 9a on the memory block 10a is connected at the source thereof to the higher order bit line 7a while being connected at the drain thereof to the lower order bit line 8a, and is also connected at the gate thereof to a first selected gate line 108a extended in the row direction. The first selected gate line 108a is connected to the PMOS transistors 9a and 9b that are respectively mounted on the memory blocks 10a and 10b aligned along the row direction in the upper part.

Thus, a predetermined gate voltage can be configured to be equally applied from the shared, single first selected gate line 108a to the two PMOS transistors 9a and 9b mounted on the different memory blocks 10a and 10b in the upper part. Further, similarly also in two memory blocks 10c and 10d aligned along the row direction in the lower part, a single first selected gate line 108b is connected to the two PMOS transistors 9c and 9d, and a predetermined gate voltage can be configured to be equally applied to the two PMOS transistors 9c and 9d from the shared, first selected gate line 108b.

On the other hand, in the exemplary embodiment, the source line 5a forming a part of the memory cell column wiring 2a is formed by a higher order source line 12a and two lower order source lines 13a and 13c. The higher order source line 12a is provided with a plurality of NMOS transistors 15a and 15c, while the single lower order source line 13a, 13c is connected to each NMOS transistor 15a, 15c.

It should be noted that in FIG. 1, as with another source line 5b, a higher order source line 12b is provided with a plurality of NMOS transistors 15b and 15d, while a single lower order source line 13b, 13d is connected to each NMOS transistor 15b, 15d as a second semiconductor switch. In the exemplary embodiment, the memory cell column wiring 2a is disposed so that the higher order bit line 7a, the lower order bit line 8a, the higher order source line 12a and the lower order source line 13a are all extended in the column direction while the plural word lines 102a to 102d extended in the row direction intersect with the higher order bit line 7a, the lower order bit line 8a, the higher order source line 12a and the lower order source line 13a.

Here, the NMOS transistor 15a, disposed as the second semiconductor switch between the higher order source line 12a and the lower order source line 13a, is connected at the source thereof to the higher order source line 12a while being connected at the drain thereof to the lower order source line 13a, and is also connected at the gate thereof to a second selected gate line 113a extended in the row direction. The second selected gate line 113a is connected to the NMOS transistors 15a and 15b that are respectively mounted on the memory blocks 10a and 10b aligned along the row direction in the upper part.

Thus, a predetermined gate voltage can be configured to be equally applied from the shared, single second selected gate line 113a to the two NMOS transistors 15a and 15b mounted on the different memory blocks 10a and 10b in the upper part. Further, similarly also on the two memory blocks 10c and 10d aligned along the row direction in the lower part, a single second selected gate line 113b is connected to two NMOS transistors 15c and 15d, and a predetermined gate voltage can be configured to be equally applied to the two NMOS transistors 15c and 15d from the shared, second selected gate line 113b.

The memory cell transistors 103, provided between the bit line 4a and the source line 5a, are N-channel memory cell transistor formed with an NMOS structure. Each memory cell transistor 103 is connected at one terminal thereof to the lower order bit line 8a while being connected at the other terminal thereof to the lower order source line 13a, and is further connected at the gate thereof to, for instance, the word line 102a. Incidentally, all the memory cell transistors 103 have the same structure that a channel region is disposed between one terminal and the other terminal on a semiconductor substrate, and a charge accumulation layer, an interlayer insulation layer and a control gate are sequentially laminated through a tunnel insulation layer on the channel region. Thus, the memory cell transistors 103 can be configured to accumulate electric charges into the charge accumulation layer or extracting electric charges accumulated into the charge accumulation layer by means of voltage to be applied to the channel region and the control gate.

The non-volatile semiconductor memory device 1 thus structured is capable of: writing data by accumulating electric charges into only the charge accumulation layer of a desired one of the memory cell transistors 103 through a data writing action; reading data written in a predetermined one of the memory cell transistors 103; and further erasing data by extracting electric charges from the charge accumulation layers of such memory cell transistors 103. Explanation will be hereinafter sequentially made for a data writing action, a data reading action and a data erasing action in the non-volatile semiconductor memory device 1.

It should be noted that in the non-volatile semiconductor memory device 1 according to the exemplary embodiment of the present invention, a data written state is defined to be a state that electric charges are accumulated into the charge accumulation layer of a predetermined one of the memory cell transistors 103 and data is configured to be erased by extracting the electric charges accumulated into the charge accumulation layer. However, the present invention is not limited to this, and in the non-volatile semiconductor memory device 1, the data written state may be defined to be a state that no electric charge is accumulated into the charge accumulation layer of a predetermined one of the memory cell transistors 103 and data may be configured to be erased by accumulating electric charges into the charge accumulation layer.

(1-2) Data Writing Action in Non-Volatile Semiconductor Memory Device

Figure 2:
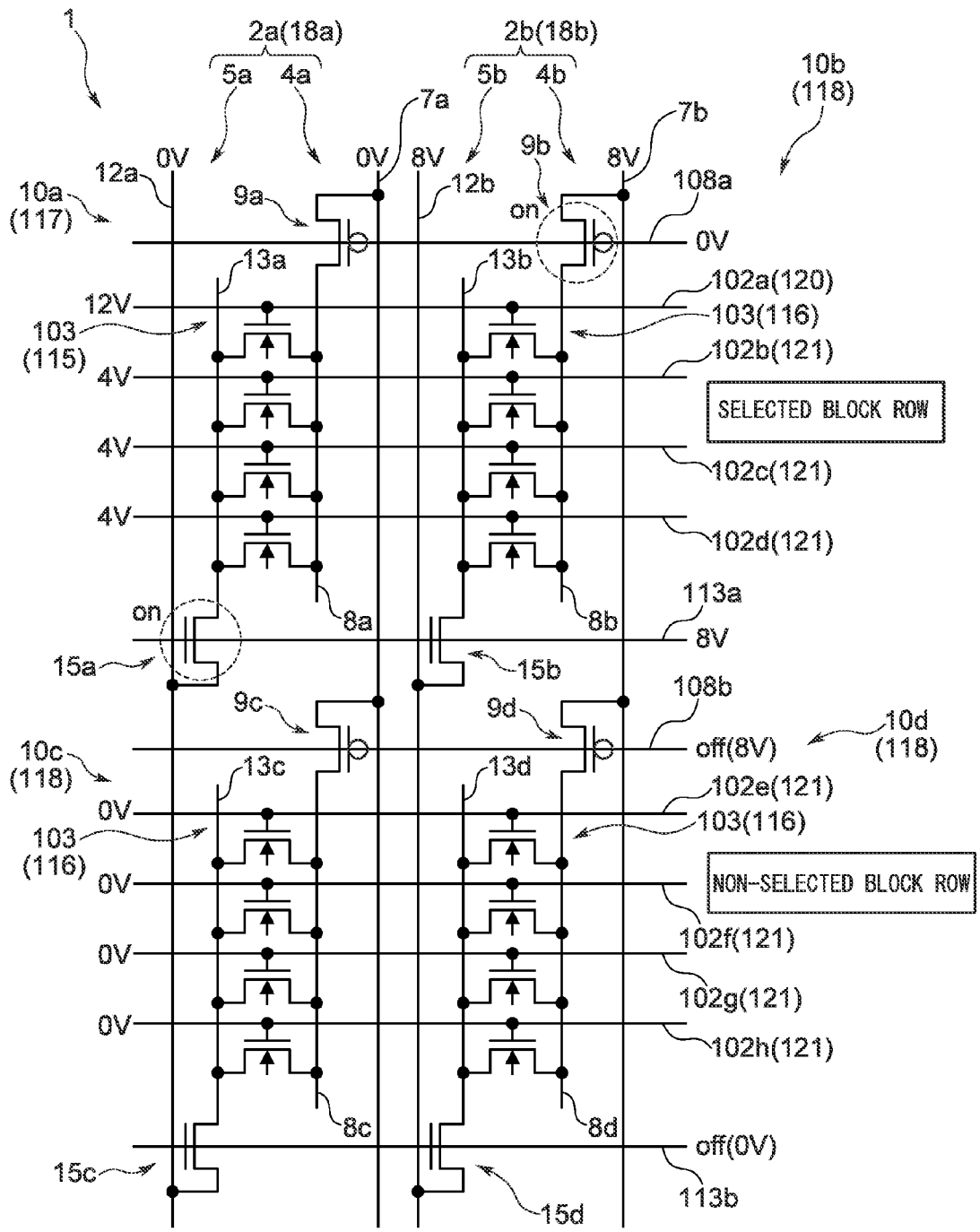
FIG. 2 is a circuit diagram showing voltage values in the respective positions in a data writing action of the non-volatile semiconductor memory device according to the first embodiment.

FIG. 2, shown with the same reference signs assigned to components corresponding to those in FIGS. 1 and 6, indicates voltage values in the respective positions of the non-volatile semiconductor memory device 1, where the memory block 10a is set as a selected block 117; the memory cell transistor 103 disposed in the first row of the selected block 117 is set as a selected memory cell transistor 115; and all the other memory blocks 10b, 10c and 10d are set as non-selected blocks 118.

Actually, in the non-volatile semiconductor memory device 1, the word line 102a connected to the gate of the selected memory cell transistor 115 is set as a selected word line 120, and a writing gate voltage of 12[V] can be applied to the selected word line 120. Further, in the non-volatile semiconductor memory device 1, a writing prevention gate voltage of 4[V] less than the writing gate voltage can be applied to the remaining non-selected word lines 121 except for the selected word line 120 in the selected block 117.

Further, at this time, in the non-volatile semiconductor memory device 1, a writing voltage of 0[V] (charge accumulating voltage) is applied to the higher order source line 12a of a memory cell column wiring 18a, i.e., the memory cell column wiring in which the selected memory cell transistor 115 is disposed (hereinafter referred to as a selected memory cell column wiring), while a voltage of 0[V] can be also applied to the higher order bit line 7a of the selected memory cell wiring 18a. And further in the non-volatile semiconductor memory device 1, a voltage of 8[V] is applied to the higher order source line 12b of a memory cell column wiring 18b, i.e., the memory cell column wiring in which only the non-selected blocks 118 are disposed (hereinafter referred to as a non-selected memory cell wiring), while a writing prevention voltage of 8[V] (charge accumulating prevention voltage) can be applied to the higher order bit line 7b of the non-selected memory cell column wiring 18b.

In addition to this, in the non-volatile semiconductor memory device 1, a P-side gate voltage of 0[V] (first gate voltage) can be configured to be applied to the first selected gate line 108a shared with the selected block 117 in the same row (hereinafter referred to as a selected block row). Accordingly, in the non-selected memory cell column wiring 18b, the PMOS transistor 9b to which the writing prevention voltage of 8[V] is being applied from the higher order bit line can be switched on.

Thus, in the non-volatile semiconductor memory device 1, with the PMOS transistor 9b in the non-selected memory cell column wiring 18b being switched on, the writing prevention voltage of 8[V] can be applied through the PMOS transistor 9b to the lower order bit line 8b of the non-selected memory cell column wiring 18b intersecting with the selected word line 120. At this time, in the non-selected memory cell column wiring 18b, the NMOS transistor 15b is switched off while a voltage of 8[V] is applied thereto from the higher order source line 12b and a voltage of 8[V] is applied thereto from the second selected gate line 113a, and the potential of the lower order source line 13b will be the same as that of the lower order bit line 8b.

Accordingly, as to a non-selected memory cell transistor 116, i.e., the memory cell transistor at which the selected word line 120 and the lower order bit line 8b of the non-selected memory cell column wiring 18b intersect with each other, the writing prevention voltage of 8[V] is applied to one terminal thereof through the PMOS transistor 9b from the higher order bit line 7b of the non-selected memory cell column wiring 18b, although the high gate voltage of 12[V] is applied to the gate thereof from the selected word line 120. Therefore, a voltage difference is reduced between the control gate and the channel region, and electric charges cannot be injected into the charge accumulation layer from the channel region without occurrence of a quantum tunneling effect.

Thus, the PMOS transistor 9b is used as the first semiconductor switch in the present invention. Therefore, unlike a case of using an NMOS transistor, the PMOS transistor 9b can be switched on even when the P-side gate voltage of 0[V], which is less than the writing prevention voltage of 8[V] to be applied to the source thereof from the higher order bit line 7b, is applied from the first selected gate line 108a. Thus, in the non-volatile semiconductor memory device 1, with use of the PMOS transistor 9b as a switch for applying the writing prevention voltage to the lower order bit line 8b of the non-selected memory cell column wiring 18b intersecting with the selected word line 120, the P-side gate voltage for switching on the PMOS transistor 9b can be reduced than the writing prevention voltage and the voltage of the entire device can be configured to be reduced by that much.

Further, at this time, in the non-volatile semiconductor memory device 1, with the application of the voltage of 8[V] as an N-side gate voltage (second gate voltage) to the second selected gate line 113a shared in the selected block row, the N-side gate voltage can be applied to the gate of the NMOS transistor 15a in the selected memory cell column wiring 18a. The NMOS transistor 15a in the selected memory cell column wiring 18a is switched on when the writing voltage of 0[V] is applied to the source thereof from the higher order source line 12a of the selected memory cell column wiring 18a while the N-side gate voltage of 8[V] is applied to the gate thereof from the second selected gate line 113a.

Thus, in the non-volatile semiconductor memory device 1, the writing voltage of 0[V] can be applied through the NMOS transistor 15a to the lower order source line 13a of the selected memory cell column wiring 18a intersecting with the selected word line 120. At this time, in the selected memory cell column wiring 18a, the voltage of 0[V] is applied to the PMOS transistor 9a from the higher order bit line 7a, while the voltage of 0[V] is applied to the PMOS transistor 9a from the first selected gate line 108a. Therefore, the PMOS transistor 9a can be switched off and the lower order bit line 8a can be turned into a floating state.

Accordingly, as to the selected memory cell transistor 115 at which the selected word line 120 and the lower order source line 13a of the selected memory cell column wiring 18a intersect with each other, the high voltage of 12[V] as a gate voltage is applied to the gate thereof from the selected word line 120, while the writing voltage of 0[V] is applied to the other terminal thereof from the lower order source line 13a through the NMOS transistor 15a in the selected memory cell column wiring 18a. Therefore, a voltage difference is increased between the control gate and the channel region. As a result, a quantum tunneling effect occurs and electric charges can be injected into the electric charge layer from the channel region.

And thus, in the non-volatile semiconductor memory device 1 according to the present invention, the writing prevention voltage is configured to be applied, with the PMOS transistor 9b being switched on. Aside from this, the writing voltage is configured to be applied, with the NMOS transistor 15a being switched on. Therefore, the P-side gate voltage and the N-side gate voltage can be separately set to have voltage values falling between the writing prevention voltage value and the writing voltage value so that the PMOS transistor 9b and the NMOS transistor 15a can be thereby switched on, and even, can be set to have voltage values less than those in a conventional device.

Incidentally, in the non-selected blocks 118 located in the row along which only the non-selected blocks 118 are aligned (hereinafter referred to as a non-selected block row), a P-side gate voltage of 8[V] is applied to the first selected gate line 108b shared by the non-selected blocks 118, and all the PMOS transistors 9c and 9d connected to the first selected gate line 108b can be equally switched off. Further in the non-selected blocks 118 located in the non-selected block row, a voltage of 0[V] is applied to the second selected gate line 113b shared by the non-selected blocks 118, and all the NMOS transistors 15c and 15d connected to the second selected gate line 113b can be equally switched off.

It should be noted in the non-volatile semiconductor memory device 1, a voltage of 0[V] is applied to the respective non-selected word lines 121 in the non-selected block row, while no voltage is applied to the respective non-selected memory cell transistors 116 of the non-selected blocks 118 in the non-selected block row. Therefore, a quantum tunneling effect does not occur in all the non-selected memory cell transistors 116 and electric charges are not injected into the charge accumulation layers from the channel regions.

Thus, in the non-volatile semiconductor memory device 1, data writing can be executed by accumulating electric charges into only the charge accumulation layer of the selected memory cell transistor 115 at which the selected word line 120 and the lower order source line 13a of the selected memory cell column wiring 18a intersect with each other, while data writing can be prevented without accumulating electric charges into the charge accumulation layers of all the other non-selected memory cell transistors 116.

(1-3) Data Reading Action in Non-Volatile Semiconductor Memory Device

Figure 3:
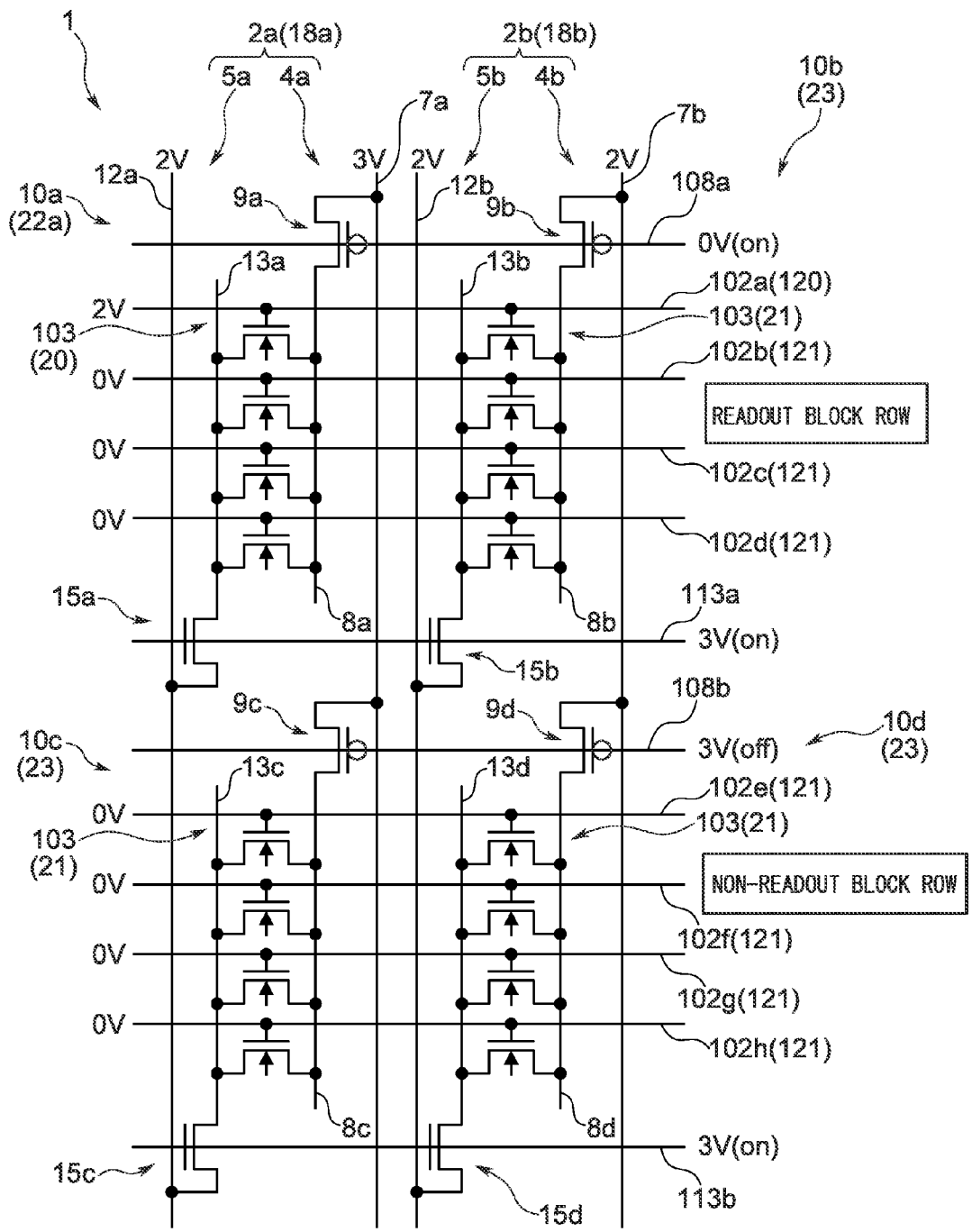
FIG. 3 is a circuit diagram showing voltage values in the respective positions in a data reading action of the non-volatile semiconductor memory device.

Here, in such non-volatile semiconductor memory device 1, data written in the selected memory cell transistor 115 can be read out therefrom as follows. Incidentally, as with FIG. 3 shown with the same reference signs assigned to components corresponding to those in FIG. 2, explanation will be hereinafter made where the memory cell transistor 103, which is disposed in the first row of, for instance, the memory block 10a in the first column and first row position among the four memory blocks 10a, 10b, 10c and 10d of the non-volatile semiconductor memory device 1, is defined as a readout memory cell transistor 20 for reading out data while all the other remaining memory cell transistors 103 are defined as non-readout memory cell transistors 21.

It should be herein noted that among the memory blocks 10a, 10b, 10c and 10d, the memory block 10a on which the readout memory cell transistor 20 is disposed is referred to as a readout block 22a while the other remaining memory blocks 10b, 10c and 10d are referred to as non-readout blocks 23. Further, the memory cell column wiring 2a in which the readout memory cell transistor 20 is disposed is herein referred to as a selected memory cell column wiring (readout memory cell column wiring) 18a.

Actually, in the non-volatile semiconductor memory device 1, a fixed voltage of 2[V] can be applied to the higher order source line 12a of the selected memory cell column wiring 18a and the higher order source line 12b of the non-selected memory cell column wiring (non-readout memory cell column wiring) 18b, while a pre-charge voltage of 3[V] can be applied to the higher order bit line 7a of the selected memory cell column wiring 18a. Further, a fixed voltage of 2[V] can be applied to the higher order bit line 7b of the non-selected memory cell column wiring 18b. In the non-volatile semiconductor memory device 1, a P-side gate voltage of 0[V] is applied to the first selected gate line 108a shared in the row in which the readout block 22a is located (hereinafter referred to as a readout block row).

In other words, as to the PMOS transistor 9a on the readout block 22a, for instance, the pre-charge voltage of 3[V] is applied to the source thereof from the higher order bit line 7a, while the P-side gate voltage of 0[V] is applied to the gate thereof from the first selected gate line 108a. As a result, the PMOS transistor 9a can be switched on. Thus, in the readout block 22a, the pre-charge voltage of 3[V] can be applied from the higher order bit line 7a to the lower order bit line 8a through the PMOS transistor 9a, and the pre-charge voltage can be applied to one ends of the memory cell transistors 103 connected to the lower order bit line 8a.

At this time, an N-side gate voltage of 3[V] can be applied to the second selected gate line 113a shared in the readout block row. Accordingly, as to the NMOS transistor 15a in the readout block row, the fixed voltage of 2[V] is applied to the source thereof from the higher order source line 12a, while the N-side gate voltage of 3[V] is applied to the gate thereof from the second selected gate line 113a. As a result, the NMOS transistor 15a can be switched on. Thus, on the readout block 22a, the fixed voltage of 2[V] can be applied from the higher order source line 12a to the lower order source line 13a through the NMOS transistor 15a, and the fixed voltage can be applied to the other ends of the memory cell transistors 103 connected to the lower order source line 13a.

On the other hand, a readout gate voltage of 2[V] cab be applied to the selected word line 120 connected to the gate of the readout memory cell transistor 20, while a readout prevention gate voltage of 0[V] lower than the readout gate voltage can be applied to the remaining non-selected word lines 121 other than the selected word line 120. Thus, as to the readout memory cell transistor 20, the pre-charge voltage of 3[V] can be applied to one end thereof from the higher order bit line 7a through the PMOS transistor 9a while the fixed voltage of 2[V] can be applied to the other end thereof from the higher order source line 12a through the NMOS transistor 15a, and further, the readout gate voltage of 2[V] can be applied thereto from the selected word line 120.

When electric charges has been herein accumulated into the charge accumulation layer of the readout memory cell transistor 20 and thus data has been written therein, the readout memory cell transistor 20 remains in the off state while being affected by the electric charges accumulated into the charge accumulation layer, even when the readout gate voltage is applied to the control gate thereof. Accordingly, the pre-charge voltage of 3[V] can be maintained without change in the higher order bit line 7a. In comparison with this, when no electric charge has been accumulated into the charge accumulation layer of the readout memory cell transistor 20 and thus no data has been written therein, the readout memory cell transistor 20 is switched on by means of the readout gate voltage applied to the control gate thereof, without being affected by electric charges in the charge accumulation layer. Accordingly, the pre-charge voltage of 3[V] can vary in the higher order bit line 7a by the amount of electric current flowing through the readout memory cell transistor 20.

It should be noted that at this time, in the row in which only the non-readout blocks 23 are aligned (hereinafter referred to as a non-readout block row), a P-side gate voltage of 3[V] equal to the pre-charge voltage is applied to the respective PMOS transistors 9c and 9d from the first selected gate line 108b, and thereby, the PMOS transistors 9c and 9d can be switched off. Thus, on the non-readout block row, the voltages from the higher order bit lines 7a and 7b are blocked by the PMOS transistors 9c and 9d. Accordingly, the voltages cannot be applied to the non-readout memory cell transistors 21 disposed in the lower order bit lines 8c and 8d connected to the PMOS transistors 9c and 9d.

Thus, the pre-charge voltage to be applied to the higher order bit line 7a can be configured to be applied to only the readout memory cell transistor 20 from which data is intended to be read out in the selected memory cell column wiring 18a. It should be noted that in the non-readout block row, an N-side gate voltage of 3[V] is applied to the second selected gate line 113b. Accordingly, the NMOS transistors 15c and 15d are switched on, and the fixed voltage is applied without change to the lower order source line 13c from the higher order source line 12a.

Thus, in the non-volatile semiconductor memory device 1, it can be configured to be determined whether or not data has been written in the readout memory cell transistor 20 by measuring the pre-charge voltage of the higher order bit line 7a, which varies depending on whether or not electric charges are accumulated into the charge accumulation layer of the readout memory cell transistor 20.

It should be noted that this example describes a case of setting a pre-charge voltage to be 3[V] and of determining whether or not the pre-charge voltage is reduced towards the fixed voltage applied to the source due to the data in the memory cell transistor. However, the pre-charge voltage is not necessarily higher than the fixed voltage. For example, it is also possible to determine whether or not data has been written in the readout memory cell transistor 20 by variously setting the pre-charge voltage to 0[V], 1[V] or etc. and by determining whether or not the pre-charge voltage is increased towards the fixed voltage.

(1-4) Data Erasing Action of Non-Volatile Semiconductor Memory Device

Figure 4:
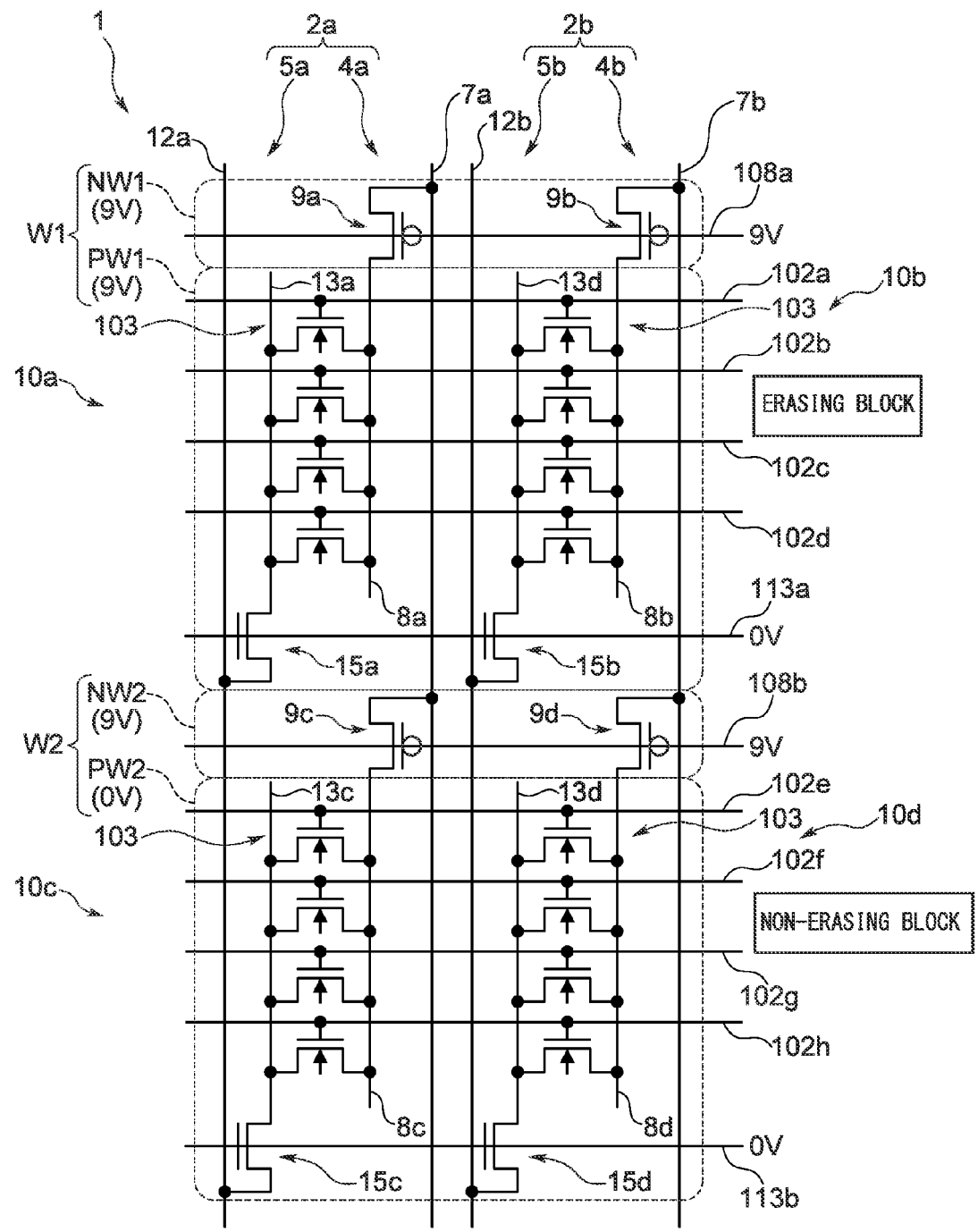
FIG. 4 is a circuit diagram showing voltage values in the respective positions in a data erasing action of the non-volatile semiconductor memory device.

Next, explanation will be hereinafter made for the data erasing action in the non-volatile semiconductor memory device 1. FIG. 4, shown with the same reference signs assigned to components corresponding to those in FIG. 1, is a schematic diagram showing a split well structure formed on a deep N-well DNW (not shown in the figure) in addition to the circuit configuration of the non-volatile semiconductor memory device 1.

In the non-volatile semiconductor memory device 1, the memory blocks 10a and 10b aligned along the row direction in the upper part and the memory blocks 10c and 10d aligned along the row direction in the lower part are herein formed in different unit well structures W1 and W2, respectively. It should be noted that the unit well structures W1 and W2 have the same structure, and therefore, explanation will be hereinafter made by focusing on one of them, i.e., the unit well structure W1. For example, in the unit well structure W1, the memory cell transistors 103 and the NMOS transistors 15a and 15b are formed on a single P-well PW1, while the PMOS transistors 9a and 9b are formed on a single N-well.

Such non-volatile semiconductor memory device 1 can be configured to execute a data erasing action for each of the substrates of the P-wells PW1 and PW2. It should be herein noted that explanation will be hereinafter made for a case of erasing the data in the memory blocks 10a and 10b formed in the unit well structure W1 in the upper part and of retaining the data, without erasing it, in the memory blocks 10c and 10d formed in the unit well structure W2 in the lower part. It should be noted that the plural memory blocks 10a and 10b from which data is erased will be collectively referred to as an erasing block, whereas the plural memory blocks 10c and 10d in which the data is retained without being erased will be collectively referred to as a non-erasing block.

In this case, on the erasing block, an erasing voltage of 9[V] can be applied to the P-well PW1 of the unit well structure W1, while a voltage of 9[V] can be also applied to an N-well NW1. Further, on the erasing block, a P-side gate voltage of 9[V] is applied to the shared, first selected gate line 108a, and thereby, the PMOS transistors 9a and 9b are switched off. Further, on the erasing block, a voltage of 0[V] is applied to the second selected gate line 113a, and thereby, the NMOS transistors 15a and 15b are also switched off. Further, a gate voltage of 0[V] can be applied to all the word lines 102a to 102d.

Hereby, on the erasing block, the erasing voltage of 9[V] is applied to the P-well PW1, while the voltage of 0[V] is applied to the control gate opposed to the P-well PW1. Therefore, the voltage of the P-well PW1 can be higher than that of the control gate. Thus, on the erasing block, electric charges accumulated into the charge accumulation layers of the memory cell transistors 103 are attracted to the P-well PW1 to which higher voltage is applied, and are taken out of the charge accumulation layers. Data can be thereby configured to be erased. Thus, the erasing block can be configured to collectively erase data from all the memory cell transistors 103 formed on the P-well PW1.

On the other hand, on the non-erasing block in which data is retained without being erased in the lower part, similarly to the erasing block, the PMOS transistors 9c and 9d can be switched off while a P-side gate voltage of 9[V] is applied to the first selected gate line 108b; similarly, the NMOS transistors 15c and 15d can be switched off while a voltage of 0[V] is applied to the second selected gate line 113b; and further, a gate voltage of 0[V] can be applied to all the word lines 102e to 102h. In addition to this, on the non-erasing block, unlike the erasing block, an erasing prevention voltage of 0[V] can be configured to be applied to the P-well PW2.

Accordingly, on the non-erasing block, no voltage difference is produced between the control gates of the memory cell transistors 103 and the P-well PW2; electric charges accumulated into the charge accumulation layers of the memory cell transistors 103 are retained in an unchanged condition without being attracted to the P-well PW2; and thereby, the data written state can be maintained. Thus, in the non-volatile semiconductor memory device 1, through the regulation of the voltages of the P-wells PW1 and PW2, data can be erased from a desired erasing block, while data can be retained in an unchanged condition without being erased from the non-erasing block other than the erasing block.

(1-5) Action and Effect

In the non-volatile semiconductor memory device 1 with the aforementioned configuration, the memory cell transistors 103 are disposed in a row and column matrix with respect to the plural memory cell column wirings 2a and 2b and the plural word lines 102a to 102h, and data can be written in the selected memory cell transistor 115 at which the selected word line 120 and the selected memory cell column wiring 18a intersect with each other based on the voltage difference between the voltage of the predetermined, selected word line 120 and that of the predetermined, selected memory cell column wiring 18a.

Here, in the non-volatile semiconductor memory device 1 according to the present invention, the PMOS transistors 9a, 9b, 9c and 9d for controlling voltage application to the memory cell transistors 103 are mounted on the memory cell column wirings 2a and 2b. In accumulating electric charges into the selected memory cell transistor 115 among the memory cell transistors 103 in order to write data in the selected memory cell transistor 115, the PMOS transistor 9b, to which the writing prevention voltage of the non-selected memory cell column wiring 18b is applied, is configured to be switched on by means of the P-side gate voltage and the writing prevention voltage is configured to be applied to the non-selected memory cell transistor 116 that intersects with the selected word line 120.

At this time, in the non-volatile semiconductor memory device 1, the PMOS transistor 9b can be switched on by applying thereto a P-side gate voltage that is lower than the writing prevention voltage to be applied to the non-selected memory cell column wiring 18b by a threshold voltage $|V_{thp}|$ of the PMOS transistor 9b. Therefore, the P-side gate voltage can be set to be lower than the writing prevention voltage, and reduction in voltage can be achieved by that much in executing a data writing action.

Further, in the present non-volatile semiconductor memory device 1, the P-side gate voltage to be applied to the first selected gate line 108a is adjusted to have a voltage value (of 0[V] in this case) greater than or equal to that of the voltage to be applied to the higher order bit line 7a of the selected memory cell column wiring 18a. Therefore, an electric field to be applied to the gate insulating film can be relaxed by switching on the PMOS transistor 9b in the non-selected memory cell column wiring 18b, and simultaneously, by switching off the PMOS transistor 9a in the selected memory cell column wiring 18a, and further by reducing the voltage difference between the substrate and the gate in the PMOS transistor 9a.

Further, the present non-volatile semiconductor memory device 1 is designed such that the NMOS transistors 15a, 15b, 15c and 15d for controlling voltage application to the memory cell transistors 103 are mounted on the memory cell column wirings 2a and 2b aside from the PMOS transistors 9a, 9b, 9c and 9d. And in the non-volatile semiconductor memory device 1, when data is written in the selected memory cell transistor 115, the N-side gate voltage is configured to be applied to the NMOS transistor from the second selected gate line 113a aside from the P-side gate voltage to be applied to the PMOS transistor 9b. The NMOS transistor in the selected memory cell column wiring is thereby switched on, and the writing voltage is accordingly configured to be applied to the selected memory cell transistor 115 from the NMOS transistor 15a.

Thus, in the non-volatile semiconductor memory device 1, the P-side gate voltage for switching on the PMOS transistor 9b and the N-side gate voltage for switching on the NMOS transistor 15a can be respectively set to have low voltage values capable of switching on the transistors 9b and 15a. Hence, it is possible to obtain flexible settings such as reduction in voltage in accumulating electric charges into the selected memory cell transistor 115 in comparison with a conventional device.

Further, in the present non-volatile semiconductor memory device 1, the N-side gate voltage is configured to be separately applied to the NMOS transistor 15a in the selected memory cell column wiring 18a from the second selected gate line 113a. With the configuration, the N-side gate voltage can be variously adjusted to be a low voltage capable of switching on the NMOS transistor 15a without being constrained by the voltage value of the P-side gate voltage to be applied to the PMOS transistor 9a. In the present non-volatile semiconductor memory device 1, the N-side gate voltage to be applied to the second selected gate line 113a is adjusted to have a voltage value (of 8[V] in this case) less than or equal to that of the voltage to be applied to the higher order source line 12b of the non-selected memory cell column wiring 18b. Therefore, an electric field to be applied to the gate insulating film of the NMOS transistor 15b can be relaxed by switching on the NMOS transistor 15a in the selected memory cell column wiring 18a, and simultaneously, by switching off the NMOS transistor 15b in the non-selected memory cell column wiring 18b, and further by reducing the voltage difference between the substrate and the gate in the NMOS transistor 15b.

Actually, in the present exemplary embodiment, the non-volatile semiconductor memory device 1 is designed such that the PMOS transistor 9a is mounted between the higher order bit line 7a and the lower order bit line 8a in the memory block 10a while the NMOS transistor 15a is designed between the higher order source line 12a and the lower order source line 13a.

Further, the memory blocks 10a, 10b, 10c and 10d are respectively designed to have such structure. Hence, in the non-volatile semiconductor memory device 1, when data is written in the selected memory cell transistor 115, the writing prevention voltage can be applied to the non-selected memory cell transistor 116 from the PMOS transistor 9b of the non-selected memory cell column wiring 18b through the lower order bit line 8b while the PMOS transistor 9b is being switched on. And simultaneously with this, in the selected memory cell column wiring 18a, the writing voltage can be applied to the selected memory cell transistor 115 from the NMOS transistor 15a through the lower order source line 13a while the NMOS transistor 15a is being switched on.

Here, in the non-volatile semiconductor memory device 1, the writing gate voltage of 12[V] is applied as $V_{W1}$ to the selected word line 120 while the writing prevention gate voltage of 4[V] is applied as $V_{W2}$ to the non-selected word lines 121. Thus, $V_{W1}-V_{W2}<9[V]$ is set as a voltage condition and a voltage difference to be controlled by the peripheral circuit of the word lines 102a to 102h is set to be less than 9[V]. Hence, MOS transistors (not shown in the figures), respectively including a gate insulating layer with a thickness of less than 13 [nm], can be used in the peripheral circuit without using special MOS transistors respectively having a gate insulating layer with a large thickness in the peripheral circuit.

Further, in the non-volatile semiconductor memory device 1, the writing prevention voltage of 8[V] is applied as $V_{B1}$ to the higher order bit line 7b of the non-selected memory cell column wiring 18b, while the writing voltage of 0[V] is applied as $V_{B2}$ to the higher order bit line 7a of the selected memory cell column wiring 18a. Thus, $V_{B1}-V_{B2}<9[V]$ is set as a voltage condition and a voltage difference to be controlled by the peripheral circuit of the higher order bit lines 7a and 7b is set to be less than 9[V]. Hence, MOS transistors (not shown in the figures), respectively including a gate insulating layer with a thickness of less than 13 [nm], can be used in the peripheral circuit without using special MOS transistors respectively having a gate insulating layer with a large thickness in the peripheral circuit.

Further, in the non-volatile semiconductor memory device 1, the writing prevention voltage of 8[V] is applied as $V_{B1}$ to the higher order bit line 7b of the non-selected memory cell column wiring 18b, and the gate voltage of the PMOS transistor 9a is adjusted. A gate-to-substrate voltage $V_{GW}$ of the PMOS transistor 9b is thereby set to be lower than the writing prevention voltage. Hence, $V_{B1}>V_{GW}$ can be set as a voltage condition. Thus, in the non-volatile semiconductor memory device 1, it is possible to suppress the voltage to be applied to the PMOS transistor 9b, and to form the gate insulating layer with a film thickness of less than 13 [nm] between the gate and the semiconductor substrate in the PMOS transistor 9b.

Here, when the PMOS transistors 9a and 9b are switched on while a gate voltage of 7[V] is applied thereto where the substrate voltages thereof are both set to be 8[V], the gate-to-substrate voltages of the PMOS transistors 9a and 9b become 1[V], and electric fields to be applied to the gate insulating films of the PMOS transistors 9a and 9b can be remarkably reduced. Similarly, when the NMOS transistors 15a and 15b are switched on while a gate voltage of 1[V] is applied thereto where the substrate voltages thereof are both set to be 0V, the gate-to-substrate voltages of the NMOS transistors 15a and 15b become 1[V], and electric fields to be applied to the gate insulating films of the NMOS transistors 15a and 15b can be remarkably reduced. As a result, reliability of the gate insulating films can be remarkably enhanced. And thus, in the non-volatile semiconductor memory device 1, voltages to be applied to the NMOS transistors 15a and 15b can be suppressed. Therefore, it is possible to form the gate insulating film with a film thickness of less than 13 [nm] between the gate and the semiconductor substrate in the NMOS transistor 15a.

In other words, such remarkable relaxation of electric field cannot be achieved when either NMOS transistors or PMOS transistors are configured to apply both of the writing voltage and the writing prevention voltage as with a conventional device. In comparison with this, in the present invention, combinational use of the PMOS transistors and the NMOS transistors can remarkably contribute to enhancement in reliability of the gate insulating films.

It should be noted that in the erasing action shown in FIG. 4, the case has been exemplified that the voltage of 0[V] is applied to the second selected gate line 113a, and thereby, the gate voltages of the NMOS transistors 15a and 15b are set to be 0[V]. However, the P-well PW1 on the erasing block is 9[V]. Therefore, rather when the gate voltages of the NMOS transistors 15a and 15b formed therein are higher than 0[V], the gate-to-substrate voltages of the NMOS transistors 15a and 15b are lowered and it is thereby possible to reduce electric fields applied to the gate insulating films of the NMOS transistors 15a and 15b. Therefore, a voltage of 4[V] or etc., for instance, may be applied to the second selected gate line 113a.

According to the aforementioned configuration, the non-volatile semiconductor memory device 1 is designed to be provided with the NMOS transistor 15a that is switched on and off by means of the N-side gate voltage aside from the P-side gate voltage for switching on and off the PMOS transistor 9b configured to apply the writing prevention voltage to the non-selected memory cell transistor 116 in accumulating electric charges into the selected memory cell transistor 115, and has a polarity opposite to that of the PMOS transistor 9b.

Accordingly, in the non-volatile semiconductor memory device 1, the P-side gate voltage for switching on the PMOS transistor 9b and the N-side gate voltage for switching on the NMOS transistor 15a can be separately adjusted, and it is possible to more flexibly set the voltage in accumulating electric charges into the selected memory cell transistor 115, for instance, to reduce the voltage in comparison with a conventional device by respectively setting the P-side gate voltage and the N-side gate voltage to have voltage values as low as possible whereby the PMOS transistor 9a and the NMOS transistor 15a can be switched on.

Further, in the present non-volatile semiconductor memory device 1, the writing prevention voltage is configured to be applied to the non-selected memory cell transistor 116 that intersects with the selected word line 120, while the PMOS transistor 9b, to which the writing prevention voltage is applied, is switched on. Therefore, the P-side gate voltage in switching on the PMOS transistor 9b can be suppressed to be lower than the writing prevention voltage. The voltage in accumulating electric charges in the selected memory cell transistor 115 can be thereby reduced by that much in comparison with a conventional device.

Further, in the non-volatile semiconductor memory device 1, it is also possible to variously adjust the N-side gate voltage of the NMOS transistor 15a configured to apply the writing voltage to the selected memory cell column wiring 18a to be a low voltage separately from the P-side gate voltage.

Thus, in the present non-volatile semiconductor memory device 1, the role of applying voltage to either the selected memory cell transistor 115 or the non-selected memory cell transistor 116 is shared by the PMOS transistor 9b and the NMOS transistor 15a through the configuration of applying a high voltage as the writing prevention voltage from the PMOS transistor 9b and of applying a low voltage as the writing voltage from the NMOS transistor 15a in accumulating electric charges into the selected memory cell transistor 115. Hence, it is possible to separately adjust the gate voltage and the source voltage of the PMOS transistor 9b and those of the NMOS transistor 15a, and finally, the gate-to-substrate voltage can be suppressed low.

It should be noted that the aforementioned exemplary embodiment has described, for instance, the case of applying the memory cell column wiring 2a in which the higher order bit line 7a, the lower order bit line 8a, the higher order source line 12a and the lower order source line 13a are disposed while being directed to the row direction. However, the present invention is not limited to this, and it is allowed to apply any one of various memory cell column wirings in which the higher order bit line 7a, the lower order bit line 8a, the higher order source line 12a and the lower order source line 13a are arbitrarily disposed in either the column direction or the row direction in accordance with the arrangement condition of the memory cell transistors 103, the PMOS transistor 9a and the NMOS transistor 15a, for instance, including a memory cell column wiring in which higher order source lines are disposed in the row direction perpendicular to the higher order bit line 7a, the lower order bit line 8a and the lower order source line 13a.

(1-6) Exemplary Modifications of Writing Action of Non-Volatile Semiconductor Memory Device According to First Exemplary Embodiment It should be noted that the aforementioned exemplary embodiment has described the case of applying the non-volatile semiconductor memory device 1 as a non-volatile semiconductor memory device configured to: apply an N-side gate voltage greater than or equal to $V_{B2}+|V_{thn}|$ (where $V_{B2}$ is the voltage of the selected memory cell column wiring (writing voltage), while $V_{thn}$ is the threshold voltage of the NMOS transistor) to the NMOS transistor; and apply a P-side gate voltage less than or equal to $V_{B1}-|V_{thp}|$ (where $V_{B1}$ is the voltage of the non-selected memory cell column wiring (writing prevention voltage), while $V_{thp}$ is the threshold voltage of the PMOS transistor) to the PMOS transistor, in writing data in the selected memory cell transistor. The non-volatile semiconductor memory device 1 is herein configured to: apply the N-side gate voltage of 8[V] greater than or equal to $V_{B2}+|V_{thn}|$ to the NMOS transistor 15a; and apply the P-side gate voltage of 0[V] less than or equal to $V_{B1}-|V_{thp}|$ to the PMOS transistor 9b. However, the present invention is not limited to this. As long as the N-side gate voltage to be applied to the NMOS transistor is greater than or equal to $V_{B2}+|V_{thn}|$ while the P-side gate voltage to be applied to the PMOS transistor is less than or equal to $V_{B1}-|V_{thp}|$, the N-side gate voltage and the P-side gate voltage may be variously set to have other voltage values.

Further, the aforementioned exemplary embodiment has explained the case that $V_{W1}-V_{W2}<9[V]$ (where $V_{W1}$ is the accumulating gate voltage of the selected word line while $V_{W2}$ is the accumulating prevention gate voltage of the non-selected word line) is established as a relational equation in accumulating electric charges into the selected memory cell transistor, and the condition that the voltage difference between $V_{W1}$ and $V_{W2}$ is less than 9[V] is configured to be satisfied by applying the writing gate voltage of 12[V] as $V_{W1}$ to the selected word line 120 and by applying the writing prevention gate voltage of 4[V] as $V_{W2}$ to the non-selected word lines 121. However, the present invention is not limited to this. As long as the aforementioned condition of $V_{W1}-V_{W2}<9[V]$ is satisfied, the voltages to be applied to the selected word line and the non-selected word line may be set to have various voltage values.

Further, the aforementioned exemplary embodiment has described the case that $V_{B1}-V_{B2}<9[V]$ (where $V_{B1}$ is the charge accumulating prevention voltage of the non-selected memory cell column wiring while $V_{B2}$ is the charge accumulating voltage of the selected memory cell column wiring) is established as a relational equation in accumulating electric charges into the selected memory cell transistor, and the condition that the voltage difference between $V_{B1}$ and $V_{B2}$ is less than 9[V] is configured to be satisfied by applying the writing prevention voltage of 8[V] as $V_{B1}$ to the higher order bit line 7b of the non-selected memory cell column wiring 18b and by applying the writing voltage of 0[V] as $V_{B2}$ to the higher order bit line 7a of the selected memory cell column wiring 18a. However, the present invention is not limited to this. As long as the aforementioned condition of $V_{B1}-V_{B2}<9[V]$ is satisfied, the voltages to be applied to the selected memory cell column wiring 18a and the non-selected memory cell column wiring 18b may be set to have various voltage values.

Further, the aforementioned exemplary embodiment has described the case that voltage is applied to the source line of the non-selected memory cell column wiring in accumulating electric charges into the selected memory cell transistor, where the voltage, applied to the source line of the non-selected memory cell column wiring, is set to have a voltage value, which is less than that of the voltage to be applied to the bit line of the non-selected memory cell column wiring and is also greater than or equal to that obtained by subtracting the threshold voltage $V_{thn}$ of the NMOS transistor from that of the N-side gate voltage to be applied to the NMOS transistor. However, the present invention is not limited to this. For example, any of the following conditions may be configured to be satisfied: that voltage is applied to the bit line of the selected memory cell column wiring in accumulating electric charges into the selected memory cell transistor, where the voltage, applied to the bit line of the selected memory cell column wiring, is set to have a voltage value, which is greater than that of the voltage to be applied to the source line of the selected memory cell column wiring and is also less than or equal to that obtained by adding the threshold voltage $V_{thp}$ of the PMOS transistor to the P-side gate voltage to be applied to the PMOS transistor; that the source line of the non-selected memory cell column wiring is set to be in an open state in accumulating electric charges into the selected memory cell transistor; and that the bit line of the selected memory cell column wiring is set to be in an open state in accumulating electric charges into the selected memory cell transistor.

(1-6-1) Writing Action in First Exemplary Modification

Figure 5:
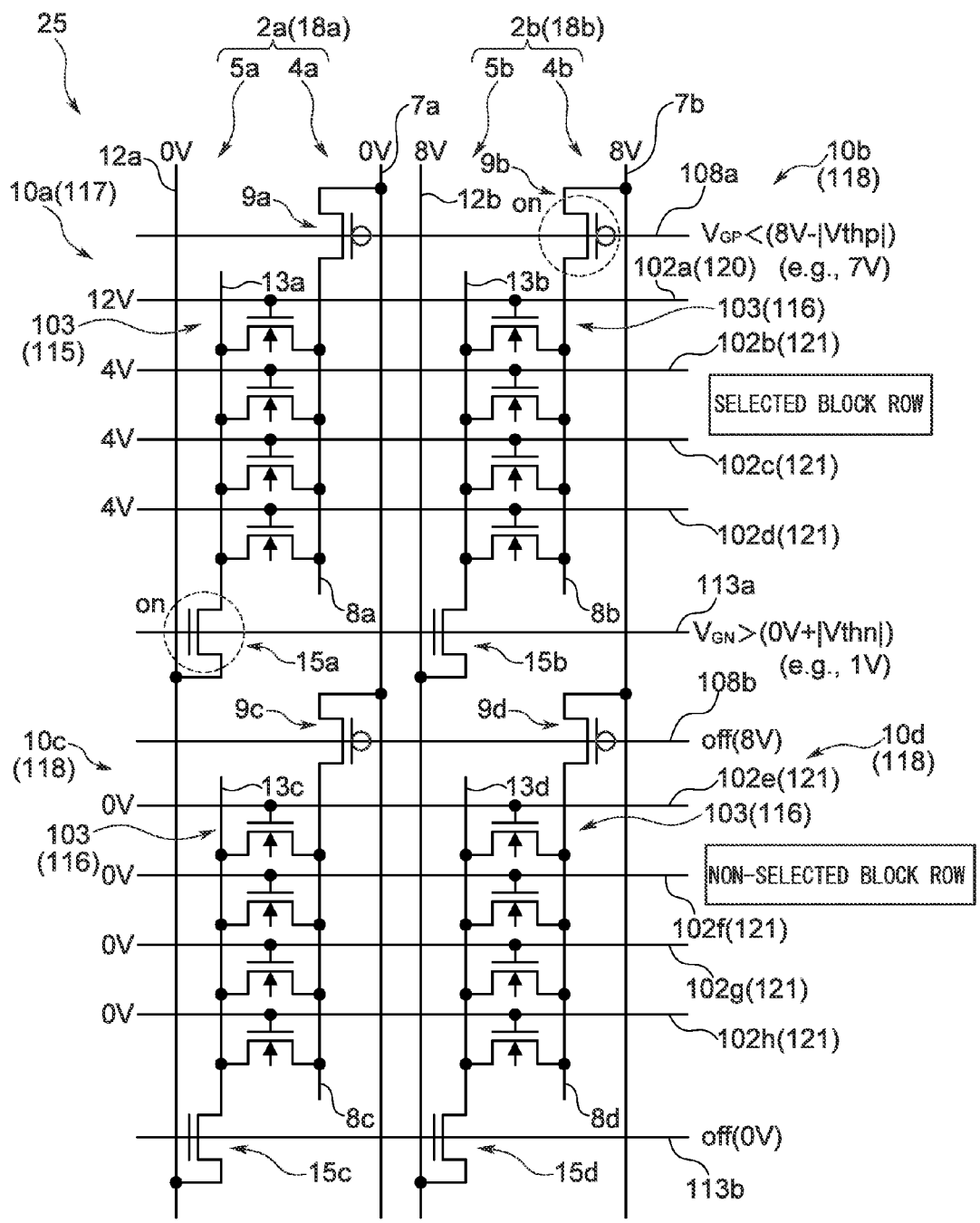
FIG. 5 is a circuit diagram showing voltage values in the respective positions in a writing action according to a first exemplary modification.

For example, in FIG. 5 shown with the same reference signs assigned to components corresponding to those in FIG. 2, a non-volatile semiconductor memory device 25 is different from the aforementioned non-volatile semiconductor memory device 1 regarding the voltage value of the P-side gate voltage that switches on the PMOS transistor 9b in the non-selected memory cell column wiring 18b in data writing and that of the N-side gate voltage that switches on the NMOS transistor 15a in the selected memory cell column wiring 18a in data writing.

Incidentally, similarly to FIG. 2, FIG. 5 shows voltages in the respective positions, for instance, where the block in the first column and first row position is set as the selected block 117 and only the memory cell transistor 103 in the first row of the selected block 117 is set as the selected memory cell transistor 115, while the other blocks are set as the non-selected blocks 118.

Actually, when a data writing action is executed, in the non-volatile semiconductor memory device 25, a P-side gate voltage of less than 8[V] can be applied to the first selected gate line 108a shared in the selected block row. The voltage value of less than 8[V] of the P-side gate voltage $V_{GP}$ is herein the one set based on a writing prevention voltage of 8[V] to be applied to the higher order bit line 7b of the non-selected memory cell column wiring 18b and a threshold voltage $V_{thp}$ of the PMOS transistor 9b in the non-selected memory cell column wiring 18b, and is also the one (e.g., 7[V]) set under a condition of switching on the PMOS transistor 9b, i.e., a condition of writing prevention voltage of $8[V]-|V_{thp}|>V_{GP}$.

The PMOS transistor 9b, to the source of which the writing prevention voltage of 8[V] is applied from the higher order bit line 7b of the non-selected memory cell column wiring 18b, is switched on when the P-side gate voltage $V_{GP}$ of less than 8[V] is applied thereto, and the writing prevention voltage of 8[V] can be applied to the lower order bit line 8b of the non-selected memory cell column wiring 18b intersecting with the selected word line 120. At this time, as to the non-selected memory cell column wiring 18b, a voltage of 8[V] is being applied to the NMOS transistor 15b from the higher order source line 12b, while a voltage of 1[V] is being applied to the NMOS transistor 15b from the second selected gate line 113a. Therefore, the NMOS transistor 15b is switched off and the electric potential of the lower order source line 13b becomes the same as that of the lower order bit line 8b.

Accordingly, as to the non-selected memory cell transistor 116 at which the selected word line 120 and the lower order bit line 8b of the non-selected memory cell column wiring 18b intersect with each other, the writing prevention voltage of 8[V] is applied to one terminal thereof from the higher order bit line 7b of the non-selected memory cell column wiring 18b through the PMOS transistor 9b, although a high voltage of 12[V] as a gate voltage is applied to the control gate thereof from the selected word line 120. Therefore, a voltage difference is reduced between the control gate and the channel region, and electric charges cannot be injected into the charge accumulation layer from the channel region without occurrence of a quantum tunneling effect.

Further, at this time, in the non-volatile semiconductor memory device 25, an N-side gate voltage of greater than 0[V] can be applied to the second selected gate line 113a shared in the selected block row. The voltage of greater than 0[V] of the N-side gate voltage $V_{GN}$ is herein the one set based on a writing voltage of 0[V] to be applied to the higher order source line 12a of the selected memory cell column wiring 18a and a threshold voltage $V_{thn}$ of the NMOS transistor 15a in the selected memory cell column wiring 18a, and is also the one (e.g., 1[V]) set under a condition of switching on the NMOS transistor 15a, i.e., a condition of writing prevention voltage of $0[V]+|V_{thn}|<V_{GN}$.

The NMOS transistor 15a, to the source of which the writing voltage of 0[V] is applied from the higher order source line 12a of the selected memory cell column wiring 18a, is switched on when the N-side gate voltage $V_{GN}$ of greater than 0[V] is applied thereto, and the writing voltage of 0[V] can be applied to the lower order source line 13a of the selected memory cell column wiring 18a intersecting with the selected word line 120. At this time, as to the selected memory cell column wiring 18a, a voltage of 0[V] is being applied to the PMOS transistor 9a from the higher order bit line 7a, while the voltage of 7[V] is being applied to the PMOS transistor 9a from the first selected gate line 108a. Therefore, the PMOS transistor 9a is switched off and the electric potential of the lower order bit line 8a becomes the same as that of the lower order source line 13a to which the writing voltage is being applied.

Thus, as to the selected memory cell transistor 115 at which the selected word line 120 and the lower order source line 13a of the selected memory cell column wiring 18a intersect with each other, the high voltage of 12[V] as the gate voltage is applied to the control gate thereof from the selected word line 120, while the writing voltage of 0[V] is applied to the other terminal thereof from the lower order source line 13a through the NMOS transistor 15a in the selected memory cell column wiring 18a. Accordingly, in the selected memory cell transistor 115, a voltage difference is increased between the control gate and the channel region, and as a result, a quantum tunneling effect occurs and electric charges can be injected into the charge accumulation layer from the channel region.

Thus, even in the non-volatile semiconductor memory device 25, the P-side gate voltage to be applied to the first selected gate line 108a can be remarkably reduced in comparison with a conventional device, while the N-side gate voltage to be applied to the second selected gate line 113a can be remarkably reduced in comparison with the conventional device.

(1-6-2) Writing Action in Second Exemplary Modification

Another non-volatile semiconductor memory device may be configured such that, in a data writing action, the same voltage value may be set for the P-side gate voltage for switching on the PMOS transistor 9b of the non-selected memory cell column wiring 18b and the N-side gate voltage for switching on the NMOS transistor 15a of the selected memory cell column wiring 18a.

For example, in the non-volatile semiconductor memory device, the P-side gate voltage and the N-side gate voltage, having the same voltage value, can be applied to the PMOS transistor 9b and the NMOS transistor 15a, respectively, from the same voltage generating source, and thus, means for applying voltage may be shared by the PMOS transistor 9b and the NMOS transistor 15a. In this case, due to the shared means for applying voltage, the entire device configuration can be simplified by that much.

For example, in such non-volatile semiconductor memory device, the P-side gate voltage to be applied to the PMOS transistor 9b can be set to be 4[V], while the N-side gate voltage to be applied to the NMOS transistor 15a can be also set to be 4[V]. Therefore, the P-side gate voltage and the N-side gate voltage can be remarkably reduced in a writing action in comparison with the aforementioned non-volatile semiconductor memory device 1. Further, in comparison with the aforementioned non-volatile semiconductor memory device 1, a voltage difference can be eliminated between the both voltages by setting the same voltage value for the both voltages. Therefore, the voltage amplitude for the entire device can be reduced by that much.

It should be noted that in the present invention, different sets of means for applying voltage may be configured to separately apply voltages to the first selected gate line 108a and the second selected gate line 113a, even when the P-side gate voltage to be applied to the PMOS transistor 9a and the N-side gate voltage to be applied to the NMOS transistor 15a have the same voltage value.

In the present invention, various voltages may be applied to the higher order bit line 7a as long as the PMOS transistor 9a in the selected memory cell column wiring 18a can be switched off. On the other hand, various voltages may be applied to the higher order source line 12b as long as the NMOS transistor 15b in the non-selected memory cell column wiring 18b can be switched off.

The PMOS transistor 9a in the selected memory cell column wiring 18a may be switched off by applying, for instance, a selected bit voltage $V_{B2}$ of 4[V] to the higher order bit line 7a of one selected memory cell column wiring 18a, whereas the NMOS transistor 15b in the non-selected memory cell column wiring 18b may be switched off by applying, for instance, a non-selected source voltage $V_{B1}$ of 4[V] to the higher order source line 12b of the other non-selected memory cell column wiring 18b.

The selected bit voltage $V_{B2}$ is the one set for satisfying a condition that the voltage value thereof is greater than or equal to that of the writing voltage to be applied to the higher order source line 12a of the selected memory cell column wiring 18a while being less than or equal to that obtained by adding a threshold voltage $|V_{thp}|$ of the PMOS transistor 9a to a P-side gate voltage $V_{GP}$ to be applied to the PMOS transistor 9a of the selected memory cell column wiring 18a (i.e., less than or equal to $(V_{GP}+|V_{thp}|)$).

On the other hand, the non-selected source voltage $V_{s1}$ is the one set for satisfying a condition that the voltage value thereof is less than that of the writing prevention voltage to be applied to the higher order bit line 7b of the non-selected memory cell column wiring 18b while being greater than or equal to that obtained by subtracting a threshold voltage $V_{thn}$ of the NMOS transistor 15b from an N-side gate voltage $V_{GN}$ to be applied to the NMOS transistor 15b in the non-selected memory cell column wiring 18b (i.e., greater than or equal to $(V_{GN}-V_{thn})$). Even with the aforementioned configuration, a non-volatile semiconductor memory device 31 can achieve advantageous effects similar to those of the aforementioned exemplary embodiment.

Further, thus in the present invention, the source voltage is adjustable in addition to the gate voltage, and for instance, the selected bit voltage $V_{B2}$ of 4[V] can be applied to the higher order bit line 7a, while the non-selected source voltage $V_{s1}$ of 4[V] can be applied to the higher order source line 12b. Therefore, it is possible to reduce a voltage difference between the source and gate voltages to be applied to the PMOS transistor 9c (in this case, source voltage of 4[V]–gate voltage of 8[V]=voltage difference of 4[V]) and a voltage difference between the source and gate voltages to be applied to the NMOS transistor 15d (in this case, source voltage of 4[V]-gate voltage of 0[V]=voltage difference of 4[V]). Accordingly, it is possible to remarkably relax electric fields applied to the gate insulating films of the PMOS transistor 9c and the NMOS transistor 15d, and to achieve enhancement in reliability of the transistors.

(2) Other Exemplary Embodiment

It should be noted that the present invention is not limited to the aforementioned exemplary embodiment, and a variety of modifications can be made within the scope of the present invention. For example, a non-volatile semiconductor memory device may be applied that is obtained by an arbitrary combination of the aforementioned non-volatile semiconductor memory devices 1 and 25 according to the first exemplary embodiment.

Further, the aforementioned exemplary embodiment has described the case that a SONOS memory cell transistor capable of accumulating electric charges into a silicon nitride film layer is applied as a memory cell transistor capable of accumulating electric charges into a charge accumulation layer. However, the present invention is not limited to this, and any other various memory cell transistors may be applied, such as a stack-type memory cell transistor in which a conductive polysilicon is disposed on a tunnel oxide film and electric charges are accumulated into the floating gate thereof.

Further, the aforementioned exemplary embodiment has described the case of applying the non-volatile semiconductor memory device 1, 25 having totally four memory blocks 10a, 10b, 10c and 10d formed in the matrix of two rows and two columns. However, the present invention is not limited to this. For example, a non-volatile semiconductor memory device may be applied that has two memory blocks formed in two columns or in two rows. Alternatively, a non-volatile semiconductor memory device may be applied that has any other various number of memory blocks formed in a matrix of two rows and one column, a matrix of three rows and one column, a matrix of three rows and three columns or etc.

Further, the aforementioned exemplary embodiment has described the case of applying the non-volatile semiconductor memory device 1 in which the plural memory cell transistors 103 are disposed between the bit line 4a and the source line 5a while one terminals thereof are connected to the bit line 4a and the other terminals thereof are connected to the source line 5a. However, the present invention is not limited to this. A NAND non-volatile semiconductor memory device may be applied that a plurality of memory cell transistors are disposed in series with respect to a bit line and the memory cell transistor in the bottom row is connected to a source.

Further, the exemplary embodiment of the present invention has explained that the device is formed on the P-type substrate. However, an N-type substrate may be used, or alternatively, an SOI substrate or etc. may be used. When any one of such substrates is used, the advantageous effects of the present invention can be achieved even without formation of the deep N-well DNW as long as the divided P-wells in the lower part of the memory cell region can be electrically separated.

The invention claimed is:

1. A non-volatile semiconductor memory device including: a plurality of memory cell column wirings to which a charge accumulating voltage or a charge accumulating prevention voltage is applied; and a plurality of memory cell transistors having an N-channel type structure and disposed in a row and column matrix with respect to the plurality of memory cell column wirings and a plurality of word lines, the non-volatile semiconductor memory device causing a selected memory cell transistor in the plurality of memory cell transistors to accumulate electric charges based on a voltage difference between the charge accumulating voltage and a voltage to be applied to the word lines, the non-volatile semiconductor memory device comprising:

a plurality of first semiconductor switches formed by PMOS transistors, the first semiconductor switches being provided for the respective memory cell column wirings; and a plurality of second semiconductor switches formed by NMOS transistors, the second semiconductor switches being provided for the respective memory cell column wirings, wherein, in a non-selected memory cell column wiring in which only non-selected memory cell transistors except for the selected memory transistor are disposed, the first semiconductor switches are configured to be switched on by means of a first gate voltage and to apply the charge accumulating prevention voltage to the non-selected memory cell transistors whereas, in a selected memory cell column wiring in which the selected memory cell transistor is disposed, the second semiconductor switches are configured to be switched on by means of a second gate voltage and to apply the charge accumulating voltage to the selected memory cell transistor.

2. The non-volatile semiconductor memory device according to claim 1, further comprising:

a first selection gate line equally applying the first gate voltage to the respective first semiconductor switches; and a second selection gate line equally applying the second gate voltage to the respective second semiconductor switches, wherein the first semiconductor switches are configured to be switched on by means of a voltage difference between the charge accumulating prevention voltage and the first gate voltage and to apply the charge accumulating prevention voltage to the non-selected memory cell transistors, and the second semiconductor switches are configured to be switched on by means of a voltage difference between the charge accumulating voltage and the second gate voltage and to apply the charge accumulating voltage to the selected memory cell transistor.

3. The non-volatile semiconductor memory device according to claim 1, wherein each of the memory cell column wirings is formed by a bit line and a source line, and each of the memory cell transistors is connected at one terminal thereof to the bit line and is connected at the other terminal thereof to the source line.

4. The non-volatile semiconductor memory device according to claim 3, wherein the bit line is formed by a higher order bit line and a lower order bit line connected to the higher order bit line through the first semiconductor switch, and each of the memory cell transistors is connected at the one terminal thereof to the lower order bit line.

5. The non-volatile semiconductor memory device according to claim 3 or 4, wherein the source line is formed by a higher order source line and a lower order source line connected to the higher order source line through the second semiconductor switch, and each of the memory cell transistors is connected to at the other terminal thereof to the lower order source line.

6. The non-volatile semiconductor memory device according to claim 1, wherein either the first semiconductor switch or the second semiconductor switch has a gate insulating layer disposed between a gate and a semiconductor substrate, the gate insulating film having a film thickness of less than 13 [nm].

7. The non-volatile semiconductor memory device according to claim 1, wherein the memory cell transistors, the first semiconductor switches and the second semiconductor switches are formed on a unit well structure divided into a predetermined number of wells.

8. The non-volatile semiconductor memory device according to claim 1, wherein a memory array in which the memory cell transistors are aligned is formed on a plurality of P-wells and the PMOS transistors are formed on an N-well electrically insulating the P-wells.

* * * * *